US007134340B2

(12) United States Patent
Samuels et al.

(10) Patent No.: US 7,134,340 B2
(45) Date of Patent: Nov. 14, 2006

(54) APPARATUS AND METHOD FOR ANCHORING MICROMACHINED STRUCTURES

(75) Inventors: Howard R. Samuels, Newton, MA (US); Michael W. Judy, Wakefield, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/130,025

(22) Filed: May 16, 2005

(65) Prior Publication Data

US 2005/0262942 A1 Dec. 1, 2005

Related U.S. Application Data

(62) Division of application No. 10/622,380, filed on Jul. 18, 2003, now Pat. No. 6,892,576.

(60) Provisional application No. 60/397,379, filed on Jul. 19, 2002.

(51) Int. Cl.
*G01P 15/125* (2006.01)
*H01G 7/00* (2006.01)

(52) U.S. Cl. .............................. 73/514.32; 73/504.12; 361/280

(58) Field of Classification Search ............. 73/514.32, 73/504.02, 504.01, 504.12; 361/280
See application file for complete search history.

(56) References Cited

U.S. PATENT DOCUMENTS

| 5,487,305 | A   |   | 1/1996  | Ristic et al. ............. 73/514.32 |
|-----------|-----|---|---------|---------------------------------------|
| 5,574,222 | A   | * | 11/1996 | Offenberg ................ 73/514.32  |
| 5,587,518 | A   |   | 12/1996 | Stevenson et al. ........... 73/1 D   |
| 5,734,105 | A   | * | 3/1998  | Mizukoshi ............... 73/504.02   |
| 5,780,740 | A   |   | 7/1998  | Lee et al. ................ 73/504.12 |
| 6,070,464 | A   | * | 6/2000  | Koury et al. ............ 73/514.32   |
| 6,370,954 | B1  |   | 4/2002  | Zerbinie et al. ......... 73/514.01   |
| 6,513,380 | B1  |   | 2/2003  | Reeds, III et al. ....... 73/504.12   |

FOREIGN PATENT DOCUMENTS

| EP | 1 083 144 A1 | 3/2001 |
| EP | 1 083 430 A1 | 3/2001 |

OTHER PUBLICATIONS

Spangler et al., *ISAAC—Integrated Silicon, Automotive, Accelerometer*, Transducers '95, Eurosensors IX, 4 pages. (Jun. 1995).

* cited by examiner

*Primary Examiner*—John E. Chapman
(74) *Attorney, Agent, or Firm*—Bromberg & Sunstein LLP

(57) ABSTRACT

Micromachined structures, such as fixed drive or sensing fingers of an inertial sensor, are anchored to a substrate using multiple anchors or elongated anchors in order to reduce the bending or twisting of the micromachined structure about the anchor point.

14 Claims, 13 Drawing Sheets

APPARATUS AND METHOD FOR ANCHORING MICROMACHINED STRUCTURES

PRIORITY

This application is a divisional of, and therefore claims priority from, U.S. patent application Ser. No. 10/622,380 filed on Jul. 18, 2003 in the names of Howard R. Samuels, David C. Hollocher, Michael W. Judy, and Thor Juneau (currently pending issuance as U.S. Pat. No. 6,892,576 on May 17, 2005), which claims priority from U.S. Provisional Patent Application No. 60/397,379 entitled Reducing Offset in Accelerometers, which was filed on Jul. 19, 2002 in the names of Howard R. Samuels, David C. Hollocher, Michael W. Judy, and Thor Juneau. The above-referenced patent applications are hereby incorporated herein by reference in their entireties.

FIELD OF THE INVENTION

The present invention relates generally to accelerometers, and more particularly to reduced offset in accelerometers.

BACKGROUND OF THE INVENTION

One of the key parameters distinguishing accelerometers is offset performance, both initial and over time and temperature. For example, lateral micromachined accelerometers having a movable mass typically employ multiple mass suspensions affixed to a substrate and positioned outside of the mass' boundaries. Sensing fingers that measure movement of the mass relative to the sensing fingers are typically also affixed to the substrate outside of the mass' boundaries, for example, around the mass. If the chip is subject to stress, such as that which may arise from the assembly process and from thermal variations, the relative position of the mass and the sensing fingers may change. For example, normal process variations cause differences between the spring constants of the springs connected between these anchors and the movable mass. If the distance between the anchors changes, the difference in spring constants can cause an unequal displacement of the mass relative to the anchors, which can move the mass relative to the sensing fingers and be interpreted as an offset.

Likewise, the sensor material may have internal stresses as a result of the manufacturing process, which can also cause an offset. For example, if the movable mass material were under tension or compression, the springs could be displaced unequally, which can move the mass relative to the sensing fingers and be interpreted as an offset. This offset is typically corrected by laser trimming resistors in the signal conditioning circuitry, or by adjusting the offset by one of several methods once the part has been packaged.

Micromachined accelerometers often include electromechanical components that are mechanically attached to the substrate. Some of these components are mobile with respect to other components, or to the substrate. Others are ideally immobile with respect to the substrate. One example of immobile components is the fixed sensing fingers of a lateral accelerometer.

Components are typically connected to the substrate by an "anchor" formed by one or more manufacturing processes. If the component suspended by this anchor is large compared to the dimensions of the anchor, the anchor may be subject to significant amounts of torque or bending moment in the application environment. This torque or bending moment may be caused, for example, by an inertial response to a mechanical event such as an acceleration or shock or by an electrostatic force between the finger and its environment such as an electrostatic force generated by a voltage applied during normal operation or a voltage arising from an electrostatic discharge event. A small amount of torsional rotation or bending displacement of the anchor can cause a large deflection of the suspended structure.

The fixed sensing fingers are not infinitely rigid. The net deflection at the tip of a finger is a combination of the bending of the finger and the bending and twisting of the anchor. Depending on the dimensions and mechanical properties of the finger and the anchor, the twisting and/or bending of the anchor can be a significant, and even the dominant term contributing to the deflection of the tip of the finger.

The displacement of an accelerometer proof mass on a spring as a result of input acceleration is given by $1/w0^2$, where $w0$ is $2*pi*f0$, and $f0$ is the resonant frequency. An accelerometer with a high resonant frequency has a low displacement per unit acceleration. Thus, any error equivalent to a displacement of the sensor causes a larger equivalent offset in units of acceleration on higher resonant frequency sensors. For example, the displacement of a fixed finger relative to the sensor due to die stress causes greater apparent offset in high resonant frequency devices.

Another cause of offset is displacement of the sensor relative to the substrate in response to stimuli other than acceleration, such as die stress. In a single-axis accelerometer, if there are two anchors connecting the springs to the substrate located along the axis of sensitivity, the offset due to die stress is proportional to the distance between the anchors. Normal manufacturing variations cause differences in the spring constants of the springs connected to each anchor. When die stress changes the separation between the anchors, the difference in spring constants causes a displacement of the sensor relative to the substrate, which is interpreted as an offset. Since the change in separation between the anchors is proportional to the distance between the anchors for a given die stress, the offset error due to this term is also proportional to the distance between the anchors:

The relationship between anchor separation (sep), resonant frequency (f0), and offset (OS) is given as:

$$OS \sim sep*f0^2.$$

SUMMARY OF THE INVENTION

In accordance with one aspect of the invention there is provided a micromachined apparatus comprising a substrate and at least one micromachined structure anchored to the substrate. The at least one micromachined structure is subject to bending or twisting about the anchor point. The at least one micromachined structure is anchored to the substrate using one of an elongated anchor and multiple anchors in order to reduce the bending or twisting of the at least one micromachined structure about the anchor point.

In accordance with another aspect of the invention there is provided a method for anchoring a micromachined structure to a substrate. The micromachined structure is subject to bending or twisting about an anchor point. The method involves providing a substrate, providing a micromachined structure, and anchoring the micromachined structure to the substrate using one of an elongated anchor and multiple anchors in order to reduce the bending or twisting of the micromachined structure about the anchor point.

In embodiments of the invention, the at least one micromachined structure may be a fixed finger structure. The fixed finger structure may be interdigitated with a movable finger structure. The fixed finger structure may be operable to sense movement of the movable finger structure or be operable to drive movement of the movable finger structure. The apparatus may be a micromachined inertial sensor, such as a micromachined accelerometer or a micromachined gyroscope. An inertial sensor may include a movable frame, in which case the at least one micromachined structure may be operable to sense movement of the frame.

DETAILED DESCRIPTION OF A PREFERRED EMBODIMENT

Figure 1:
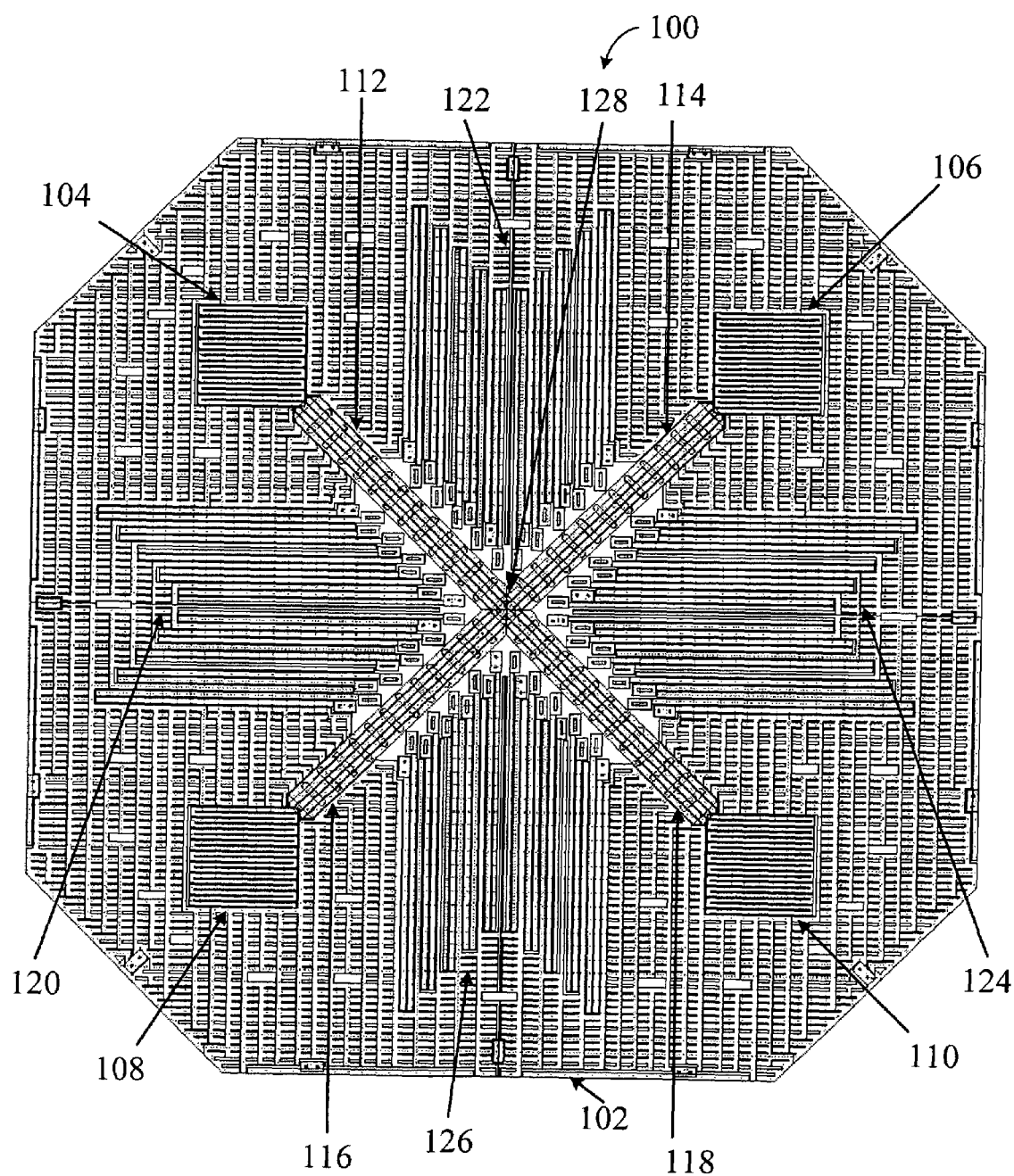
FIG. 1 shows an exemplary two-axis accelerometer including mass support structures in a cruciform configuration anchored to a substrate using a single central anchor in accordance with an embodiment of the present invention.

In various embodiments of the present invention, accelerometer offset is reduced or eliminated by forming mass support structures within an inner periphery of the mass, affixing the mass support structures to the substrate by at least one anchor positioned near the mass' center of mass, and affixing the sensing fingers proximate to the anchor. The mass support structures can be affixed to the substrate using a single anchor or multiple anchors that are positioned close together. The sensing fingers can be affixed to the substrate or to the mass support structures.

In an embodiment of the present invention, the accelerometer mass is suspended from various support structures. The various support structures are typically formed within the mass' boundaries. The support structures typically include various suspension springs and support arms. The suspension springs couple the mass to the support arms. The support arms are anchored to the chip using a single anchor or multiple anchors placed close together, typically close to the mass' center of mass.

In a two-axis accelerometer having four suspension springs, the support arms are typically configured in a cruciform configuration. The suspension springs sit at the ends of the support arms. The support arms may be formed as a single structure that is anchored to the chip or as individual structures that are anchored separately to the chip.

In order to reduce offset, the support arms are anchored to the chip using a single anchor or multiple anchors placed close together near the mass' center of mass and the sensing fingers are affixed proximate to the support arm anchor(s). In this way, chip stresses are substantially decoupled from the sensor (i.e., the mass, the mass support structures, and the sensing fingers) so that chip stresses do not cause unequal displacement of the mass fingers and sensing fingers.

The suspension springs are typically placed away from the center of mass, toward the periphery of the mass. This tends to increase the rotational resonant frequency of the mass about the lateral axes and improve control over the mass. Specifically, with the mass support structures anchored toward the center of mass, the rotational resonant frequency of the mass about the lateral axes is dependent in part upon the distance between the suspension point of the mass and the anchor point, where the rotational resonant frequency is relatively low (which is undesirable) when the suspension point is close to the anchor point and is relatively high (which is more desirable) when the suspension point is far from the anchor point. Furthermore, with the suspension springs and support structures anchored toward the center of mass, the stability of the mass is dependent in part upon the distance between the suspension point of the mass and the anchor point, where the mass is less stable (i.e., more apt to tilt) when the suspension point is close to the anchor point and is more stable (i.e., less apt to tile) when the suspension point is far from the anchor point.

The accelerometer typically includes a number of sensing fingers that are interlaced with fingers that are integral to the mass. These sensing fingers may be anchored to the substrate or may be coupled or integral to the mass support structures. In a single-axis accelerometer, the fixed sensing fingers are typically oriented perpendicular to the axis of motion of the mass. In a two-axis accelerometer, fixed sensing fingers are typically oriented along both axes.

Movement of the mass causes the position of the integral fingers to change relative to the fixed sensing fingers, resulting in a detectable change in capacitance that can be measured as an acceleration.

Chip stresses can move the positions of the fixed sensing fingers relative to the support arm anchor(s) and therefore to the mass fingers. This movement of the mass fingers relative to the sensing fingers can be interpreted as an offset. In order to reduce this offset, the fixed sensing fingers may be affixed to the substrate close to the mass support structure anchor(s)

or alternatively may be mechanically (but not electrically) coupled to the support arm anchor(s).

In order to affix the sensing fingers close to the mass support structure anchor(s), it is desirable to have fewer fixed sensing fingers that are positioned as close as possible to the anchor(s). In order for the fewer fixed sensing fingers to produce a sufficient capacitance change for detecting accelerations, the fixed sensing fingers are typically formed longer. The longer fixed sensing fingers are more prone to deflection than shorter fingers, due to bending of the finger as well as twisting and bending about the anchor. In an embodiment of the present invention, multiple anchors or a single elongated anchor is used to anchor each fixed sensing finger in order to reduce the amount of deflection caused by twisting and bending.

Figure 4:
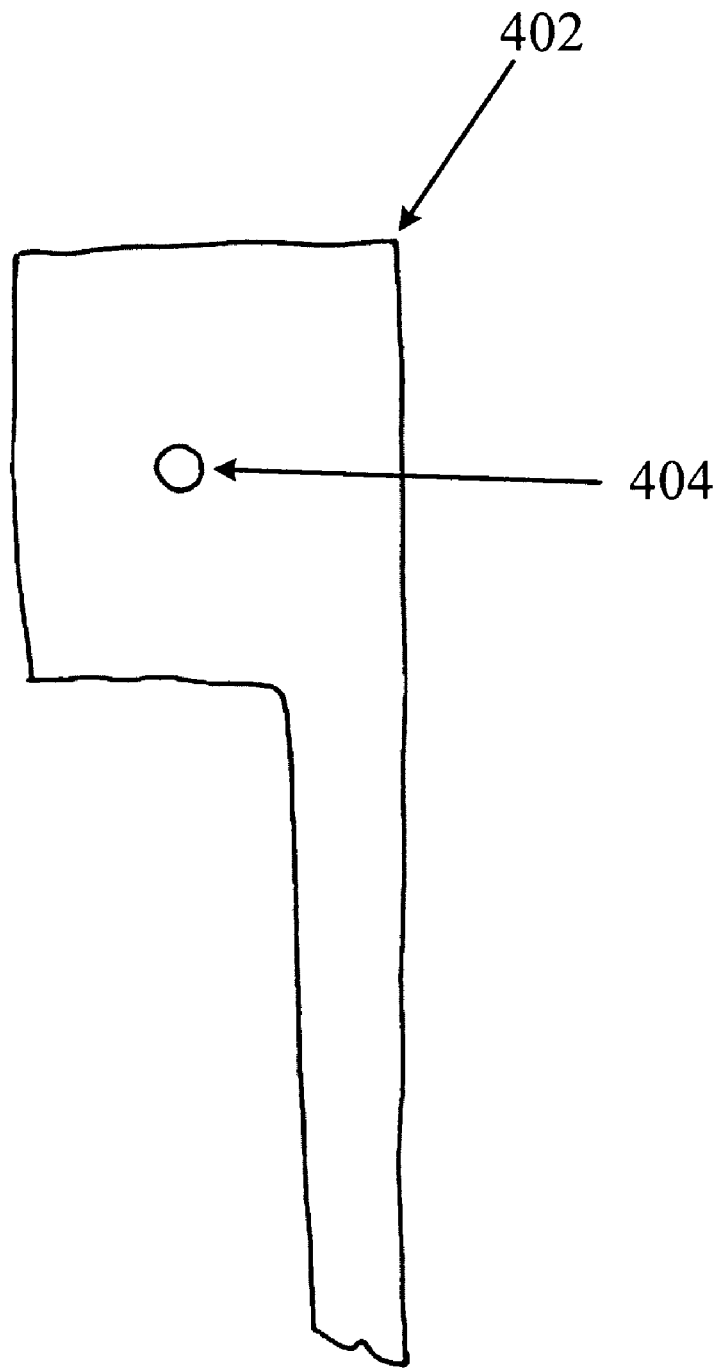
FIG. 4 shows a portion of a fixed sensing finger including a single round anchor as known in the prior art.

FIG. 4 shows a portion of a fixed sensing finger 402 including a single round anchor 404 as known in the prior art. One problem with this configuration is that it allows for rotation of the sensing finger 402 about the single round anchor 404.

Figure 5:
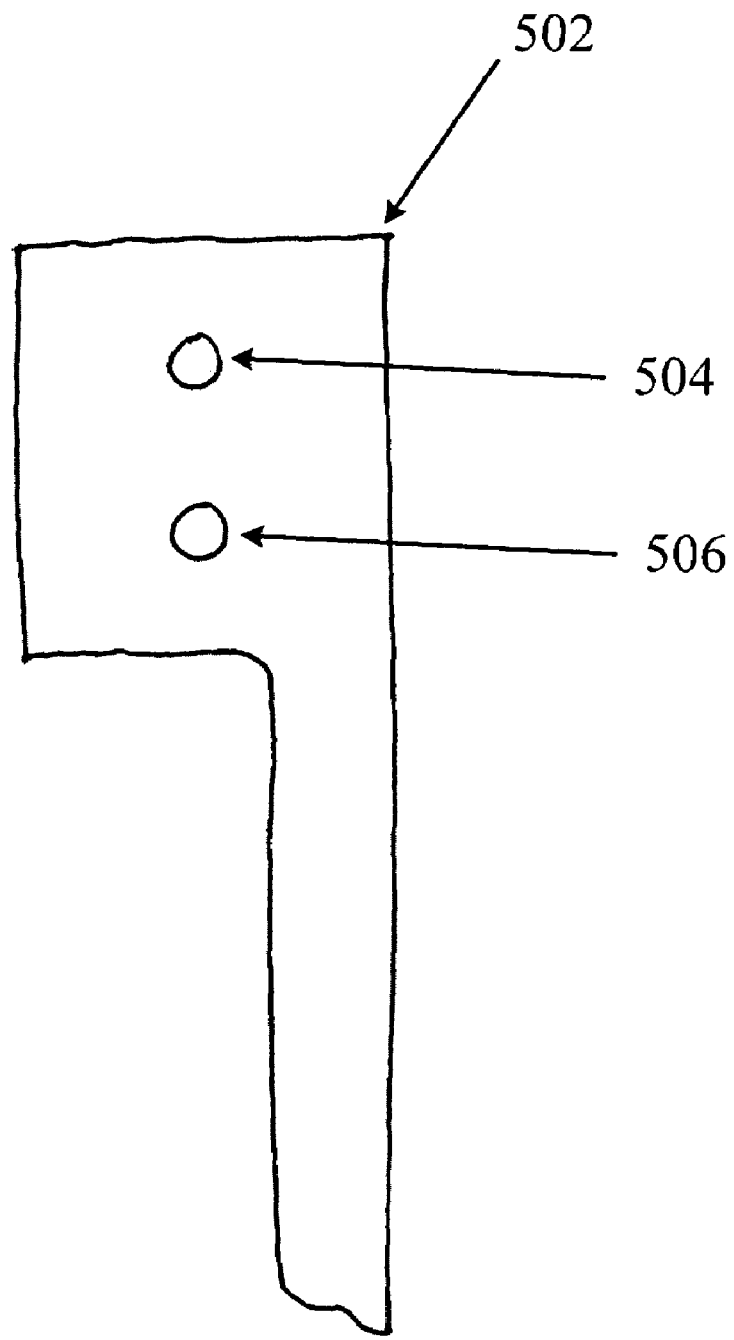
FIG. 5 shows a portion of a fixed sensing finger including a double anchor in accordance with an embodiment of the present invention.

FIG. 5 shows a portion of a fixed sensing finger 502 including two anchors 504 and 506 in accordance with an embodiment of the present invention. This double anchor configuration reduces rotation of the sensing finger 502 about the anchors 504 and 506.

Figure 6:
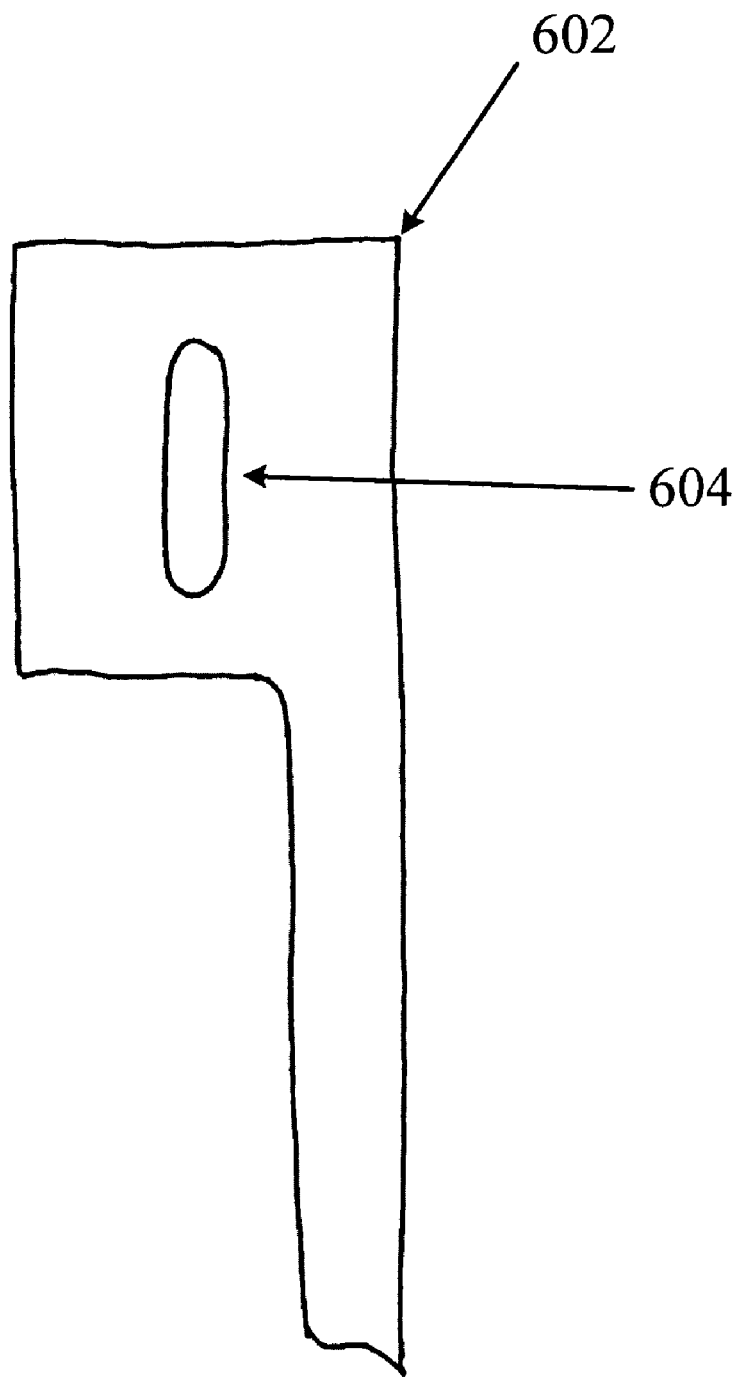
FIG. 6 shows a portion of a fixed sensing finger including an elongated anchor in accordance with an embodiment of the present invention.

FIG. 6 shows a portion of a fixed sensing finger 602 including an elongated anchor 604 in accordance with an embodiment of the present invention. This elongated anchor configuration reduces rotation of the sensing finger 602 about the anchor 604.

Figure 2:
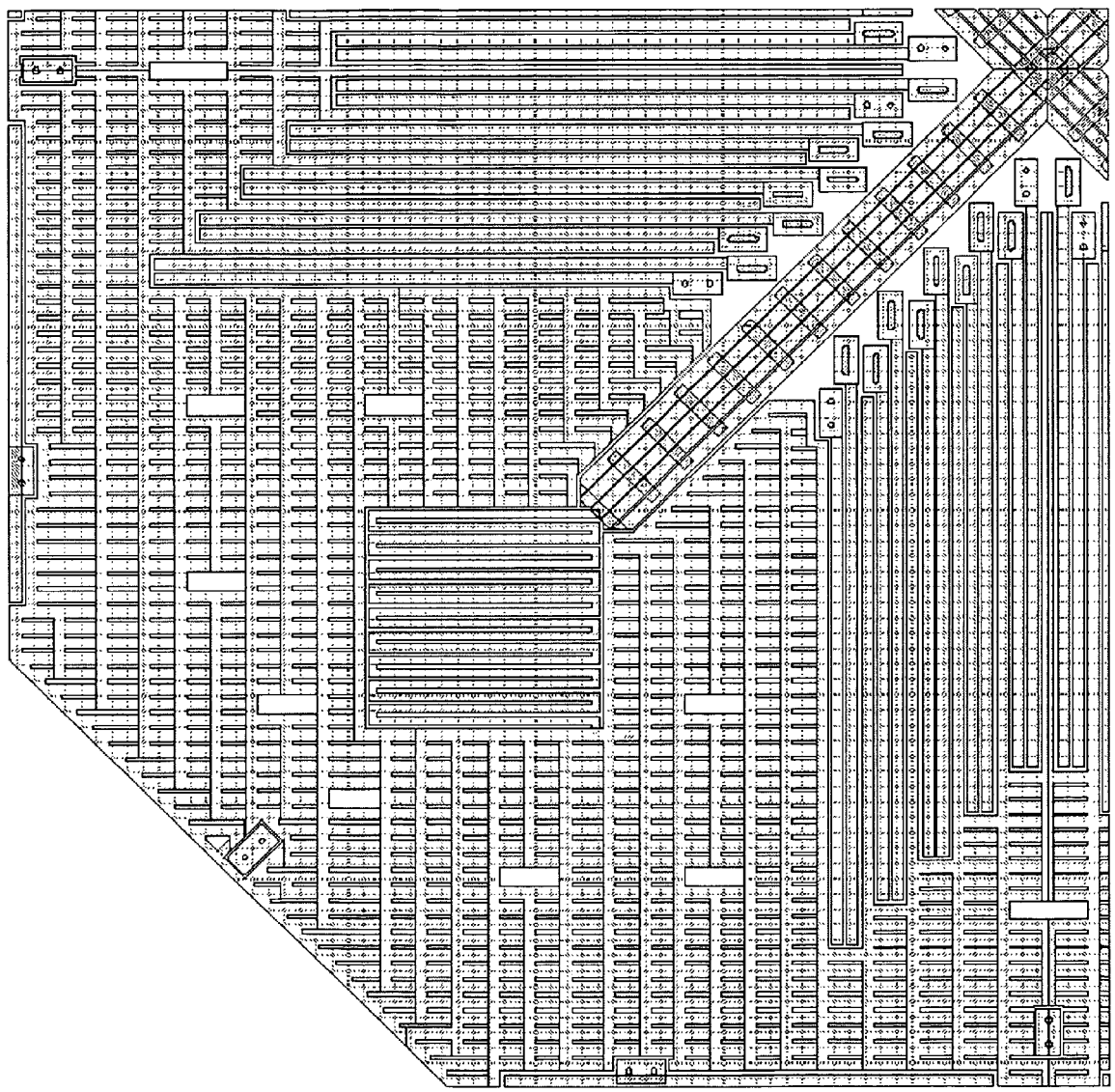
FIG. 2 shows in greater detail a support arm and a suspension spring of the accelerometer shown in FIG. 1.
Figure 3:
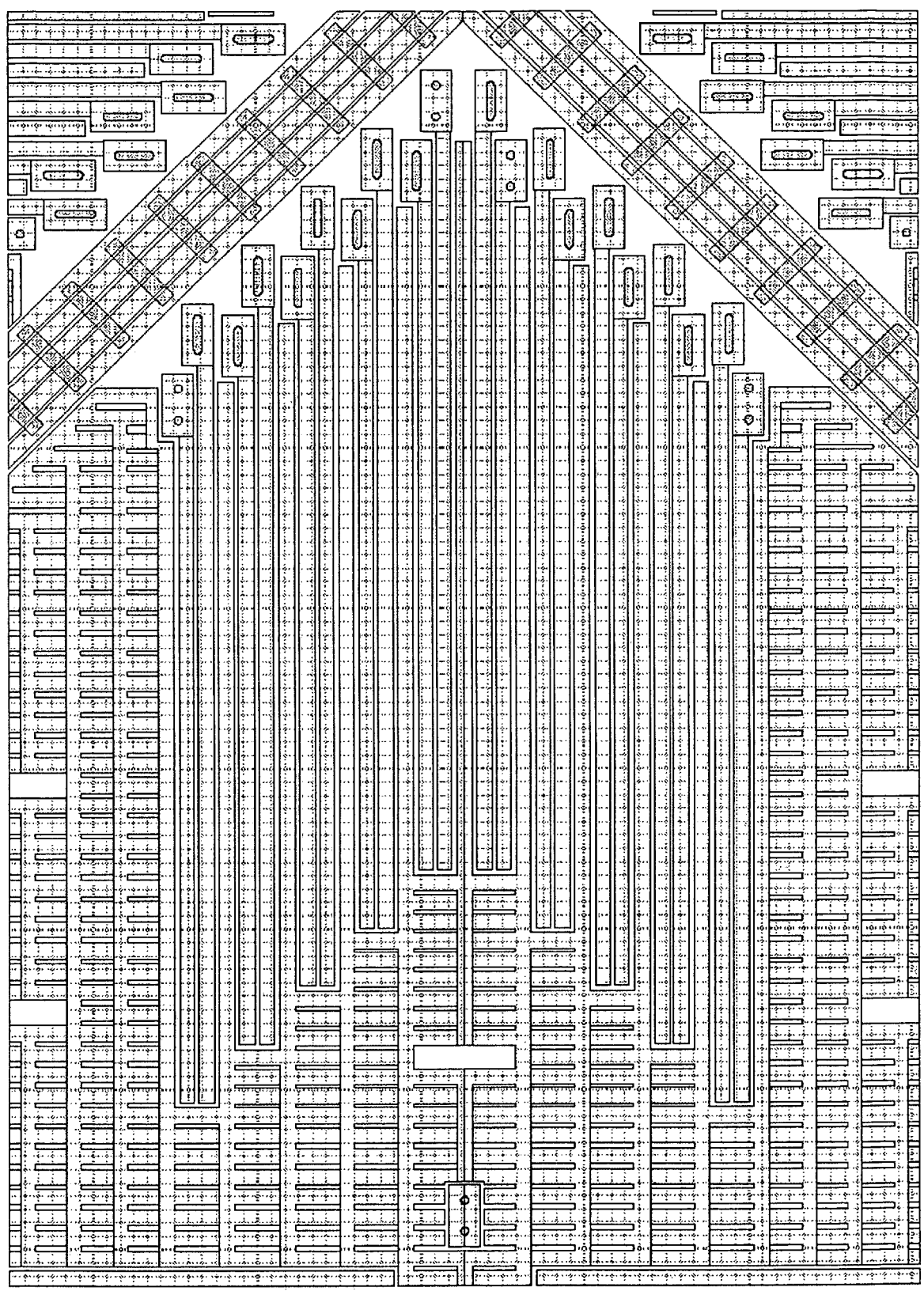
FIG. 3 shows in greater detail a group of fixed sensing fingers of the accelerometer shown in FIG. 1.

FIG. 1 shows an exemplary two-axis accelerometer 100 including, among other things, a mass with integral fingers 102; mass support structures including suspension springs (104, 106, 108, 110) and support arms (112, 114, 116, 118), and fixed sensing fingers (120, 122, 124, 126). The fixed sensing fingers (120, 122, 124, 126) are interlaced with the mass fingers, with typically two fixed sensing fingers between each pair of mass fingers. FIG. 2 shows a support arm and a suspension spring in greater detail. FIG. 3 shows a group of fixed sensing fingers in greater detail.

In this embodiment, the four support arms (112, 114, 116, 118) are configured in a cruciform configuration that is anchored to the substrate (not shown) by a single square anchor 128 positioned at the point where the four support arms meet. Among other things, the square anchor reduces the amount of bending or twisting about the anchor by torque generated by the support arms. It should be noted that the present invention is in no way limited to a single anchor or to anchoring at the mass' center of mass.

As shown in FIG. 2, a suspension spring is connected to end of each support arm and to the mass. The suspension springs are fabricated in a serpentine formation. The suspension springs are positioned away from the center anchor and toward the periphery of the mass 102.

In this embodiment, the fixed sensing fingers are positioned so that their anchor points are close to the support arm anchor(s). Therefore, the fixed sensing fingers are fabricated so that they emanate outward from the "V" portions between each pair of support arms along the two lateral axes of motion of the mass. In order to reduce the number of fixed sensing fingers and the mean distance between the fixed sensing finger anchors and the support arm anchor(s), the fixed sensing fingers are elongated. The longer sensing fingers are more susceptible to rotation about the anchor point. Therefore, in this embodiment, the fixed sensing fingers are affixed to the substrate using elongated anchors or double anchors in order to reduce rotation about the anchor.

Figure 11:
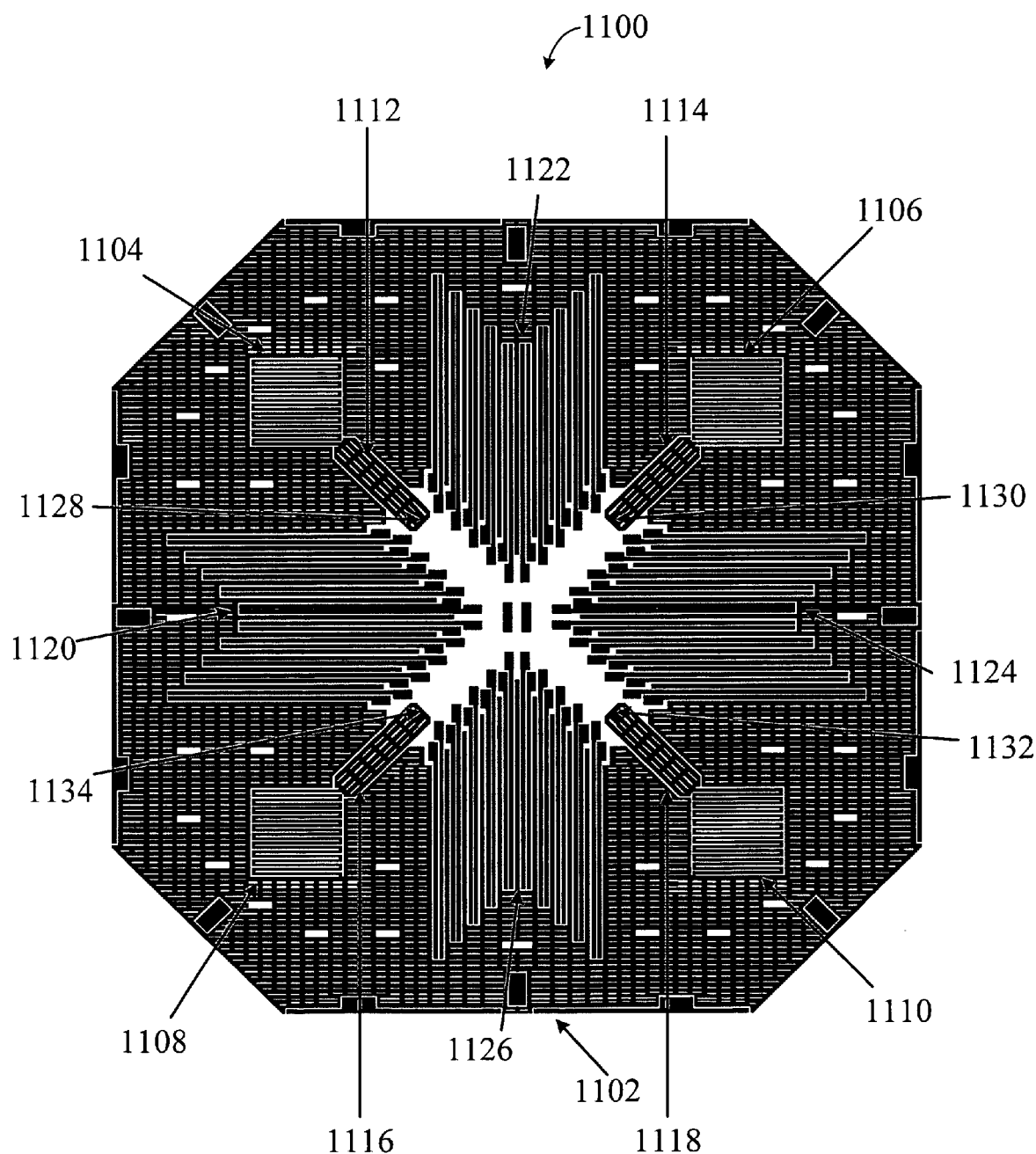
FIG. 11 shows an exemplary two-axis accelerometer including mass support structures anchored to a substrate using multiple anchors in accordance with an embodiment of the present invention.

FIG. 11 shows another exemplary two-axis accelerometer 1100 including, among other things, a mass with integral fingers 1102; mass support structures including suspension springs (1104, 1106, 1108, 1110) and support arms (1112, 1114, 1116, 1118), and fixed sensing fingers (1120, 1122, 1124, 1126). The fixed sensing fingers (1120, 1122, 1124, 1126) are interlaced with the mass fingers, with typically two fixed sensing fingers between each pair of mass fingers.

In this embodiment, the four support arms (1112, 1114, 1116, 1118) are anchored individually to the substrate by anchors 1128, 1130, 1132, and 1134, respectively.

Figure 7:
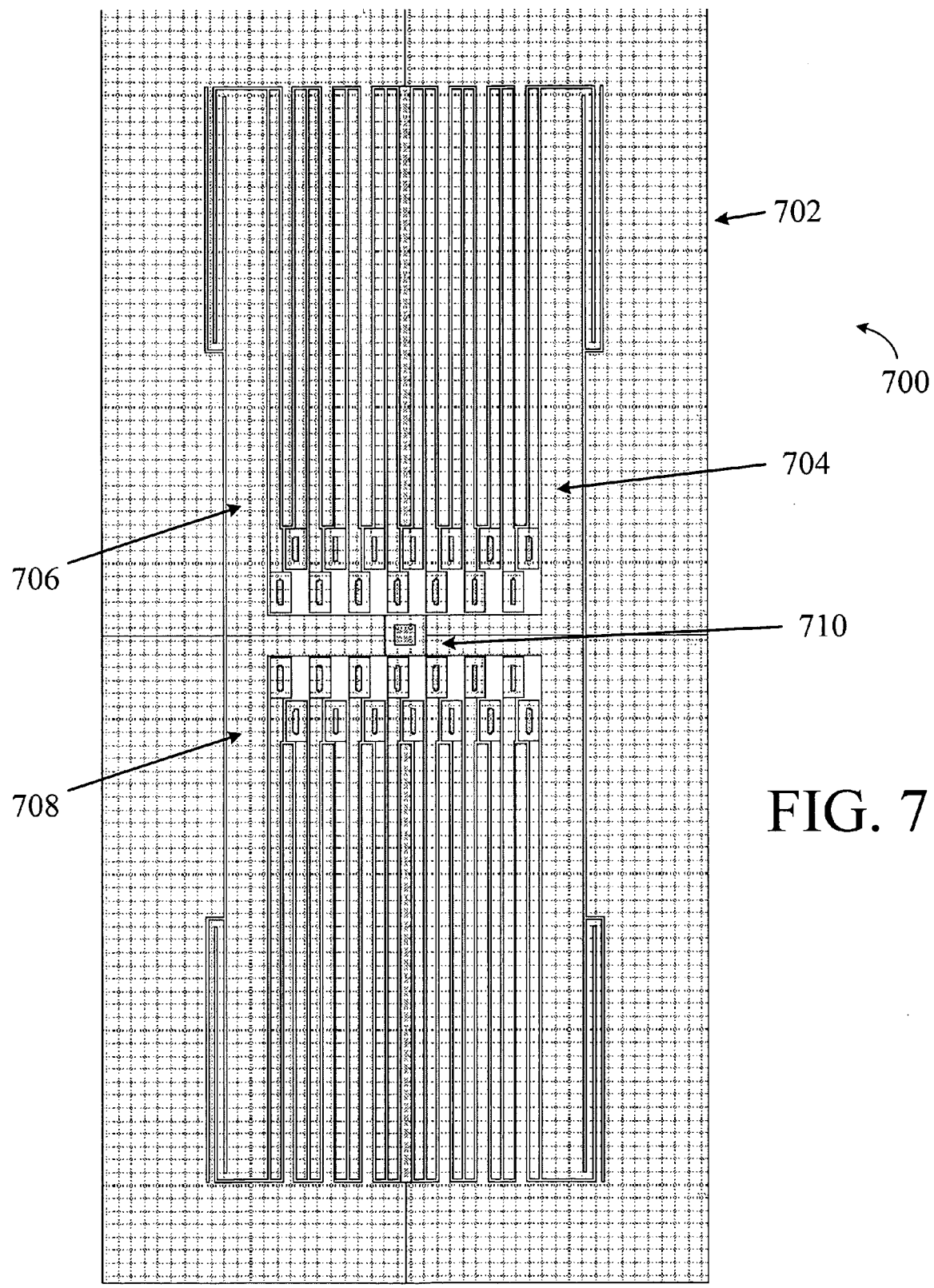
FIG. 7 shows an exemplary single-axis accelerometer including mass support structures in an "H" configuration anchored to a substrate using a single central anchor in accordance with an embodiment of the present invention.

FIG. 7 shows an exemplary single-axis accelerometer 700 in which the mass support structures are configured in an "H" configuration in accordance with an embodiment of the present invention. The accelerometer 700 includes a mass with integral fingers 702, mass support structures 704 that are anchored to the substrate (not shown) by a single anchor 710 positioned at the middle of the "H" configuration, and sensing fingers 706 and 708 affixed to the substrate. The mass 702 is supported by a suspension spring at the end of each support arm.

The fixed sensing fingers 706 and 708 are preferably positioned so that their anchor points are close to the center anchor 710 for the mass support structures 704. Therefore, the fixed sensing fingers 706 and 708 are fabricated so that they emanate outward from the "U" portions between each pair of support arms perpendicular to the axis of motion of the mass. In order to reduce the number of fixed sensing fingers and the mean distance between the fixed sensing finger anchors and the support arm anchor(s), the fixed sensing fingers are elongated and are anchored using a single elongated anchor or a double anchor in order to reduce rotation of the sensing finger about the anchor.

Figure 12:
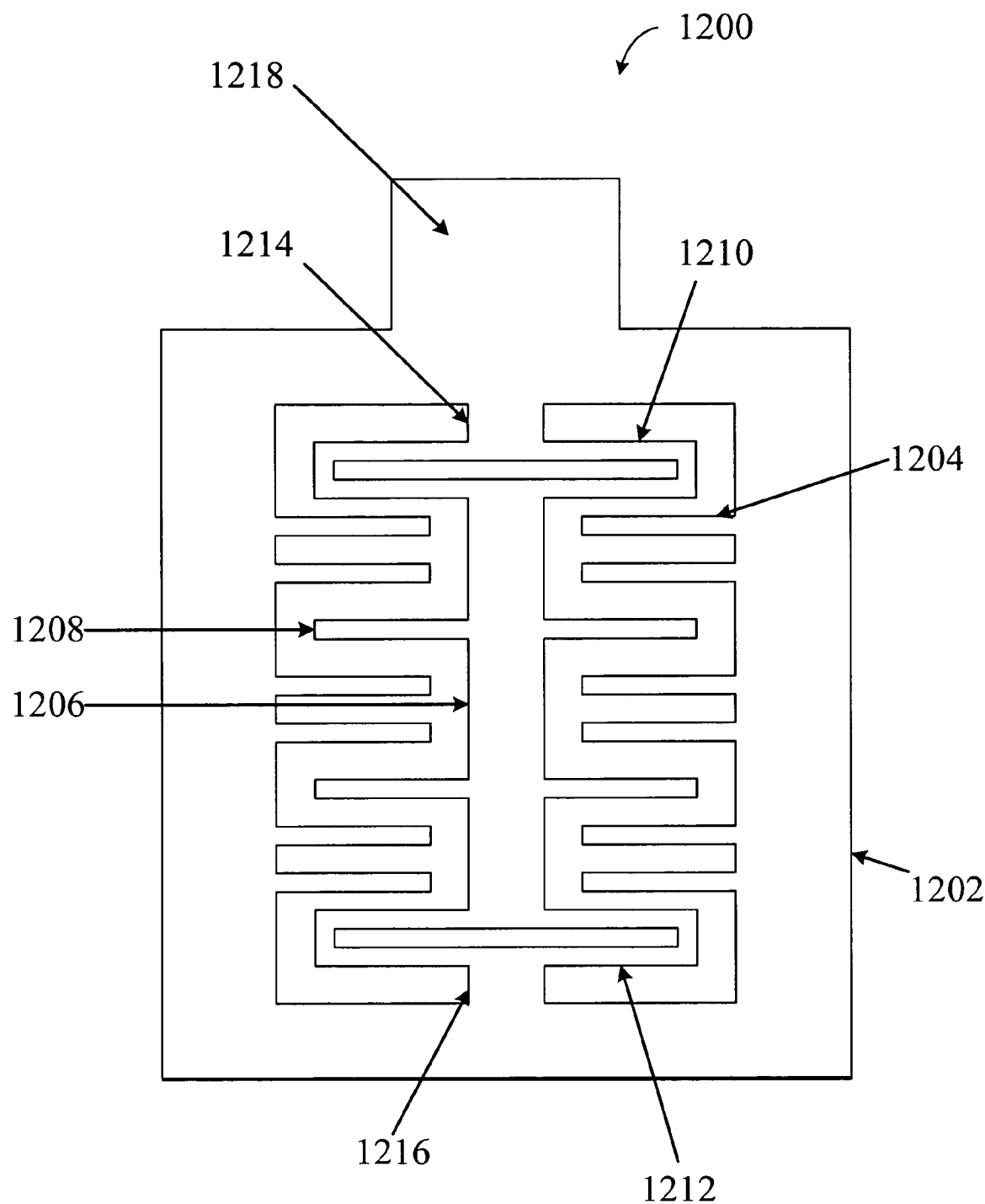
FIG. 12 shows an exemplary accelerometer in which offset is reduced by suspending all structures within a frame in accordance with an embodiment of the present invention.

FIG. 12 shows an exemplary accelerometer 1200 in which offset is reduced by suspending all structures within a frame 1202. The frame 1202 has an outer periphery, a cavity defining an inner periphery, and a plurality of elongated sensing fingers 1204 along a portion of the inner periphery. A mass 1206 is positioned within the inner periphery of the frame 1202. The mass 1206 includes a plurality of elongated fingers 1208 positioned substantially alongside the sensing fingers 1204. The mass 1206 is suspended from the frame 1202 at either end by two springs 1210 and 1212, which are connected to the frame 1202 respectively at bridges 1214 and 1216. The entire structure, including the frame 1202 with sensing fingers 1204, the mass 1206 with fingers 1208, the springs 1210 and 1212, and the bridges 1214 and 1216 are typically formed from a single wafer, and itself is suspended from other components at bridge 1218. It should be noted that components inside the frame 1202 can be oriented perpendicular to the axis shown.

In embodiments of the invention, the fixed sensing fingers are electrically coupled in various configurations in order to detect accelerations using changes in capacitance due to movement of the mass. Furthermore, the micromachined accelerometer can be fabricated from different types of wafers, including silicon wafers, polysilicon wafers, single-stack silicon-on-insulator (SOI) wafers, and multiple-stack SOI wafer. When the micromachined accelerometer is fabricated from SOI wafers that include a ground layer, the fixed sensing fingers can be anchored through to the ground layer in order to make certain electrical connections to the fixed sensing fingers.

Figure 8:
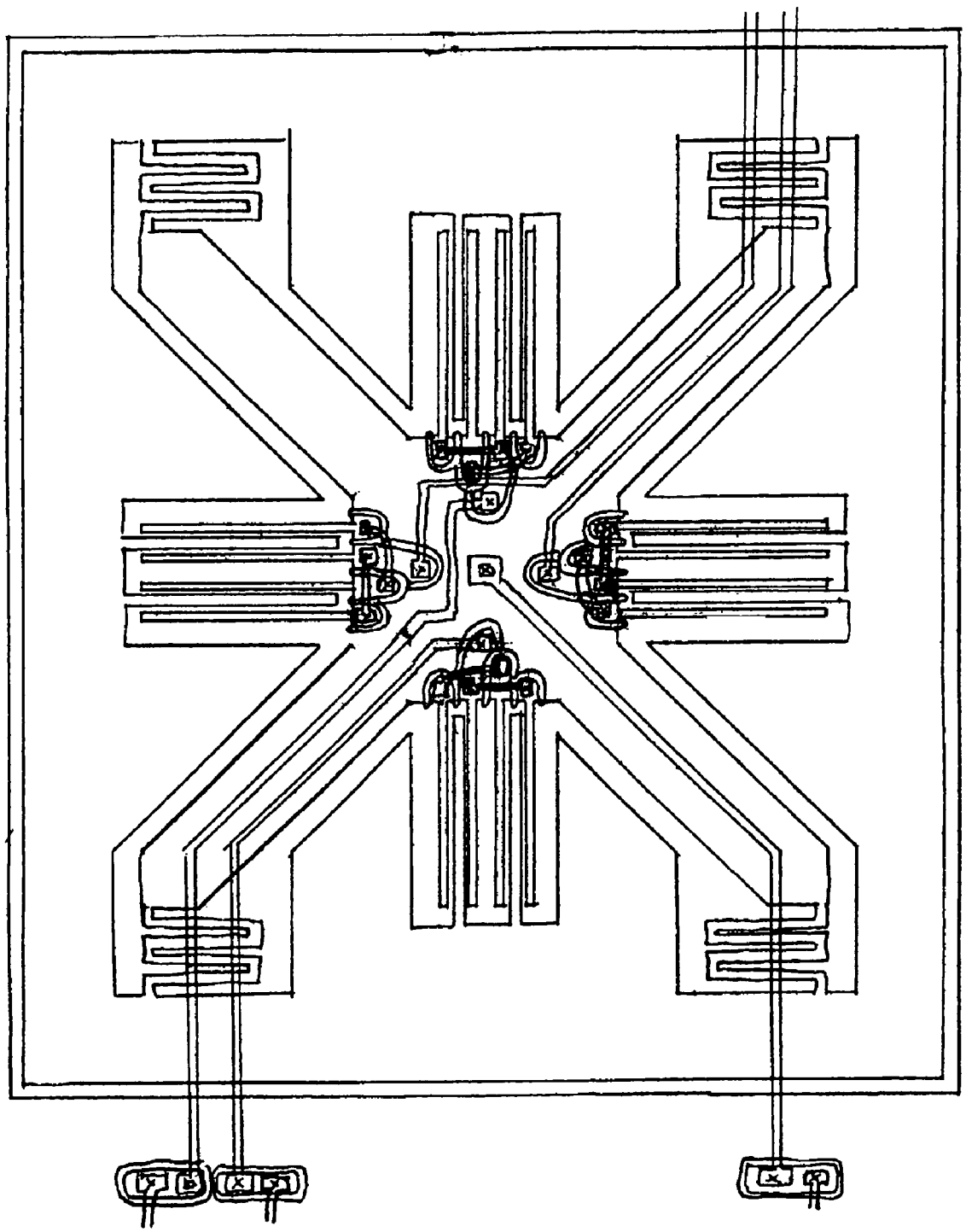
FIG. 8 shows an exemplary dual-axis accelerometer formed from a silicon-on-insulator (SOI) wafer including a ground layer in which the sensing fingers are coupled or integral to the mass support structures in accordance with an embodiment of the present invention.

FIG. 8 shows exemplary accelerometer embodiment in which the sensing fingers are coupled or integral to the mass support structures. In this embodiment, the mass support structures are configured in a cruciform configuration, and the sensing fingers emanate outward from the mass support structures. In this configuration, the sensing fingers need to be electrically decoupled from the mass support structures. In a preferred embodiment of the invention, the sensing fingers are electrically decoupled from the mass support structures using an SOI wafer with a ground layer to form trenches around the sensing fingers.

Figure 9:
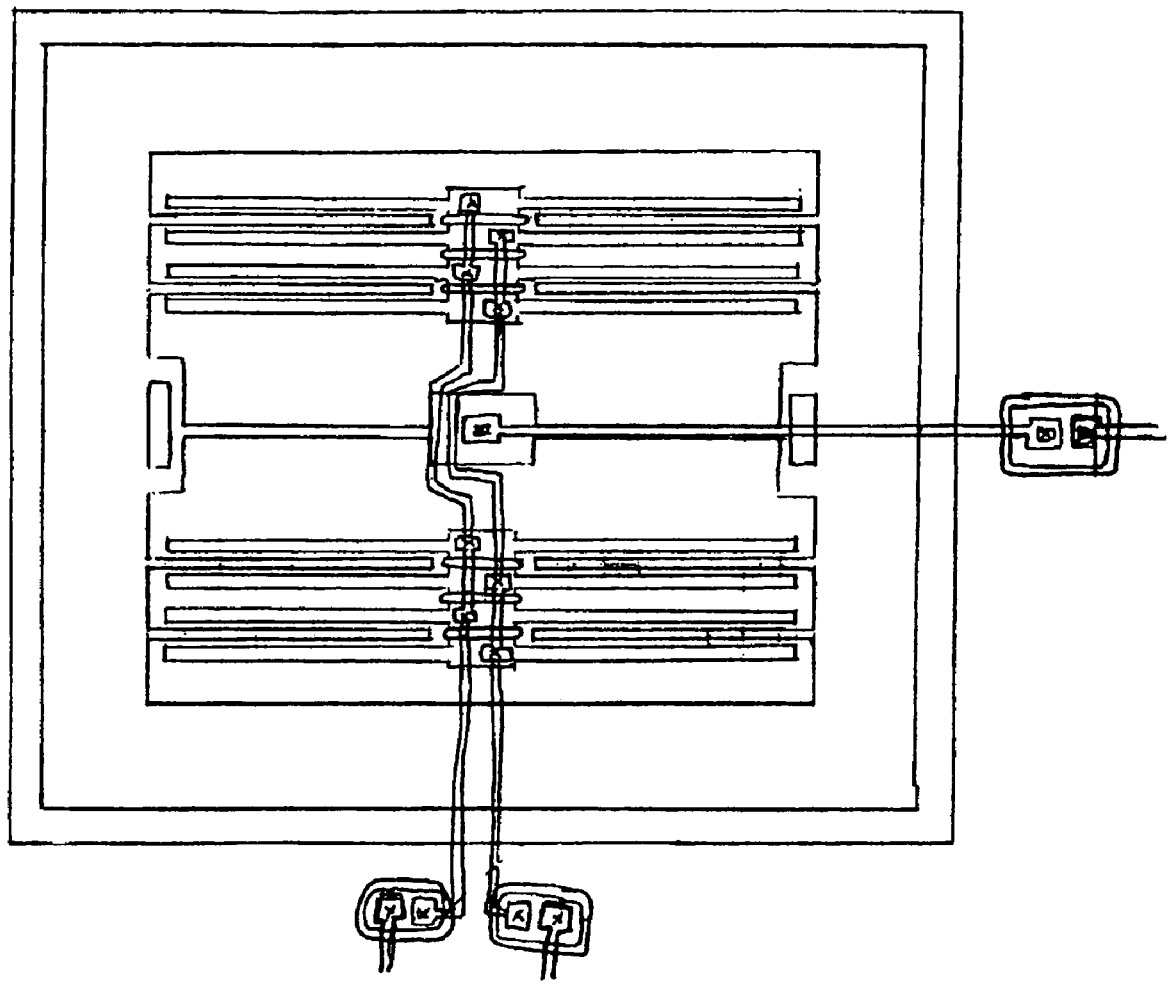
FIG. 9 shows an exemplary single-axis accelerometer formed from a silicon-on-insulator (SOI) wafer including a ground layer in which the sensing fingers are coupled to the substrate in accordance with an embodiment of the present invention.

FIG. 9 shows exemplary accelerometer embodiment in which the sensing fingers are coupled to the substrate. An SOI wafer with a ground layer is used to provide electrical connections to the sensing fingers.

Figure 10:
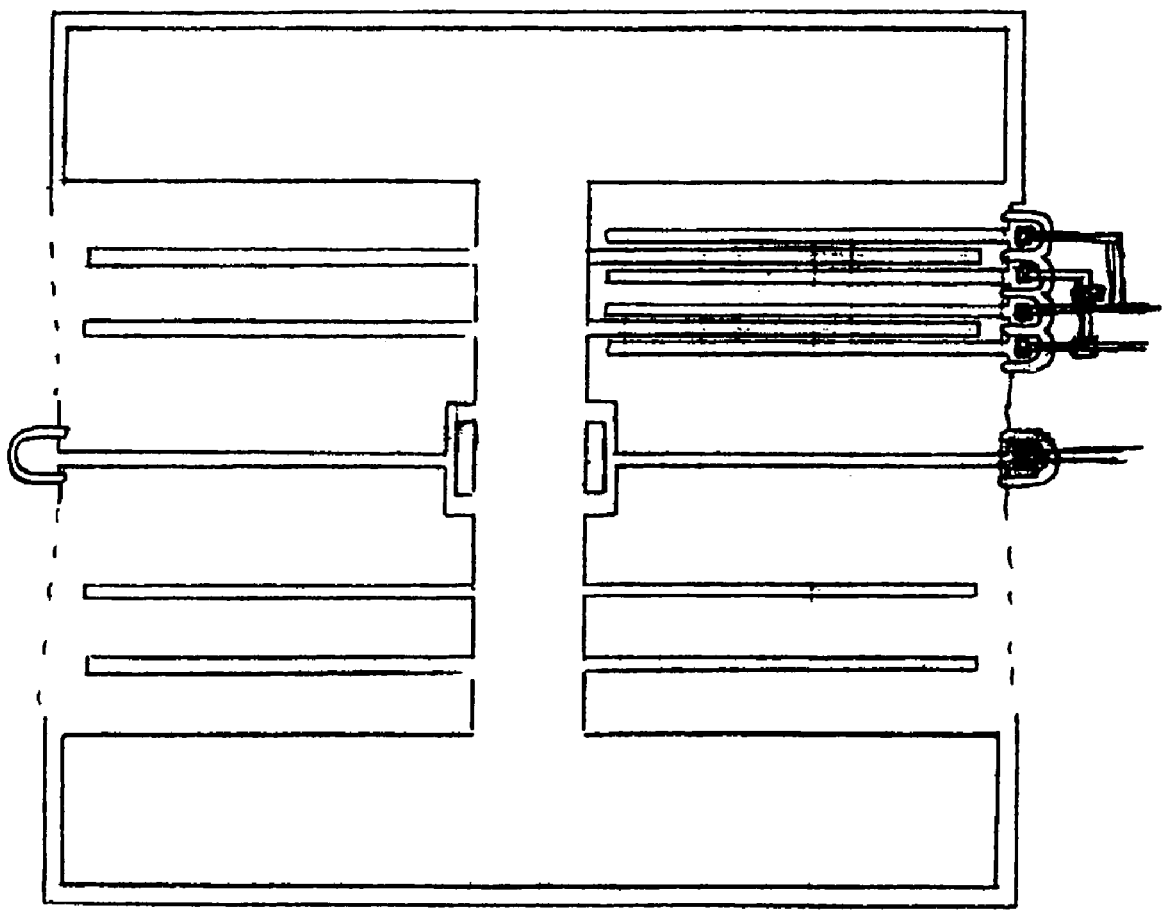
FIG. 10 shows an exemplary single-axis accelerometer formed from a silicon-on-insulator (SOI) wafer without a ground layer in which a mass is suspended within a frame in accordance with an embodiment of the present invention.

FIG. 10 shows an exemplary accelerometer embodiment in which a mass is suspended within a frame. The frame includes sensing fingers. In this configuration, the sensing fingers need to be electrically decoupled from the frame. The sensing fingers are electrically isolated from the frame using an SOI wafer without a ground layer.

Figure 13:
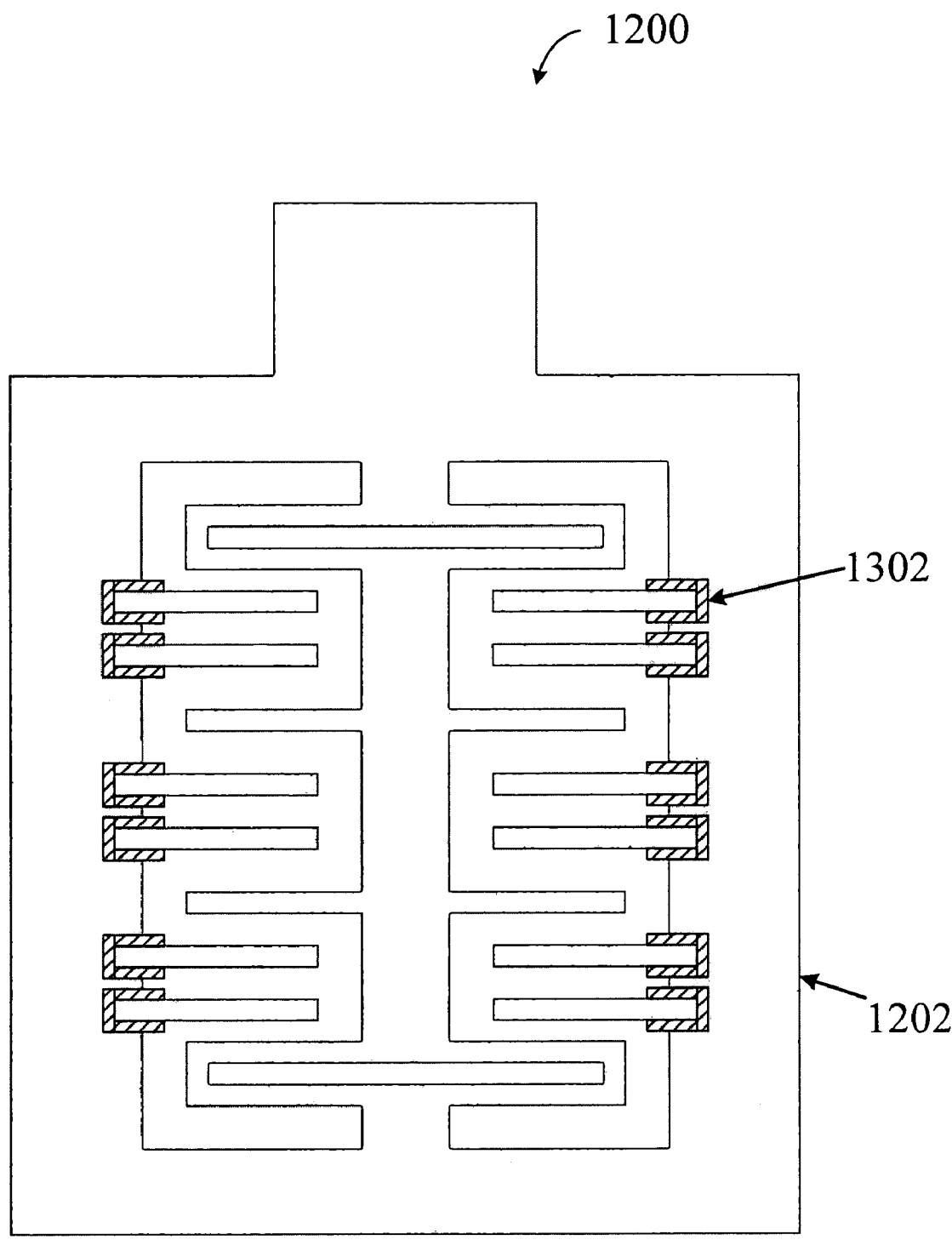
FIG. 13 shows electrical decoupling of the sensing fingers from the frame in the accelerometer shown in FIG. 12.

FIG. 13 shows the accelerometer 1200 with electrically isolating trenches 1302 formed in the SOI wafer around each sensing finger in order to electrically decouple each sensing finger from the frame 1202.

It should be noted that the present invention is not limited to the way in which the mass support structures are anchored to the substrate. The mass support structures can be anchored using a single anchor or multiple anchors. The anchor(s) may be placed at the center of mass or away from the center of mass. When placed away from the center of mass, the placement of the anchors is typically symmetrical about the center of mass, but this is not required. The anchor may be any shape, including, but not limited to, round, square, or elongated.

The present invention may be embodied in other specific forms without departing from the true scope of the invention. The described embodiments are to be considered in all respects only as illustrative and not restrictive.

What is claimed is:

1. A micromachined apparatus comprising:
    a substrate; and
    a succession of individual elongated fixed finger structures anchored to the substrate, wherein each pair of adjacent elongated fixed finger structures is interdigitated with at least one movable finger structure, and wherein each of the elongated fixed finger structures is anchored to the substrate using one of an elongated anchor and multiple anchors.

2. A micromachined apparatus according to claim 1, wherein the fixed finger structures are capacitively coupled with the at least one movable finger structure for sensing movement of the at least one movable finger structure.

3. A micromachined apparatus according to claim 1, wherein the fixed finger structures are capacitively coupled with the at least one movable finger structure for driving movement of the at least one movable finger structure.

4. A micromachined apparatus according to claim 1, wherein the apparatus is a micromachined inertial sensor.

5. A micromachined apparatus according to claim 4, wherein the apparatus is a micromachined accelerometer.

6. A micromachined apparatus according to claim 4, wherein the apparatus is a micromachined gyroscope.

7. A micromachined apparatus according to claim 4, wherein the inertial sensor includes a movable frame including the at least one movable finger structure, and wherein the elongated fixed finger structures are capacitively coupled with the at least one movable finger structure of the frame for sensing movement of the frame.

8. A method of reducing bending or twisting of elongated fixed finger structures, the method comprising:
    forming a succession of individual elongated fixed finger structures such that each pair of adjacent elongated fixed finger structures is interdigitated with at least one movable finger structure; and
    anchoring each of the elongated fixed finger structures to a substrate using at least one of an elongated anchor and multiple anchors, whereby bending or twisting of the elongated fixed finger structures about their respective anchor points is reduced by such anchoring.

9. A method according to claim 8, wherein the fixed finger structures are capacitively coupled with the at least one movable finger structure for sensing movement of the at least one movable finger structure.

10. A method according to claim 8, wherein the fixed finger structures are capacitively coupled with the at least one movable finger structure for driving movement of the at least one movable finger structure.

11. A method according to claim 8, wherein the apparatus is a micromachined inertial sensor.

12. A method according to claim 11, wherein the apparatus is a micromachined accelerometer.

13. A method according to claim 11, wherein the apparatus is a micromachined gyroscope.

14. A method according to claim 11, wherein the inertial sensor includes a movable frame including the at least one movable finger structure, and wherein the elongated fixed finger structures are capacitively coupled with the at least one movable finger structure of the frame for sensing movement of the frame.

* * * * *